United States Patent [19]

Schwefel

[11] 4,225,931
[45] Sep. 30, 1980

[54] INTERPOLATION APPARATUS FOR DIGITAL ELECTRONIC POSITION MEASURING INSTRUMENT

[75] Inventor: Ernst Schwefel, Traunreut, Fed. Rep. of Germany

[73] Assignee: Dr. Johannes Heidenhain GmbH, Traunreut, Fed. Rep. of Germany

[21] Appl. No.: 915,955

[22] Filed: Jun. 15, 1978

[30] Foreign Application Priority Data

Jul. 1, 1977 [DE] Fed. Rep. of Germany ....... 2729697

[51] Int. Cl.² .............................................. G06F 7/38
[52] U.S. Cl. .............................. 364/577; 235/92 GC; 364/723
[58] Field of Search ................................ 364/577, 723; 235/92 PL, 92 PS, 92 EV, 92 MP, 92 GC

[56] References Cited

FOREIGN PATENT DOCUMENTS 407569  8/1966  Switzerland .............................. 364/577
1092525 11/1967  United Kingdom ...................... 364/577

*Primary Examiner*—David H. Malzahn
*Attorney, Agent, or Firm*—Hume, Clement, Brinks, Willian & Olds, Ltd.

[57] ABSTRACT

An interpolation process is described for use with an incremental position measuring device which produces a periodic analog output signal. The output signal is digitized and then applied as an input to a digital computer programmed to calculate the interpolation value of the signal. In the preferred embodiment the computer is also programmed to apply a number of corrections to the digitized signal prior to interpolation.

8 Claims, 3 Drawing Figures

INTERPOLATION APPARATUS FOR DIGITAL ELECTRONIC POSITION MEASURING INSTRUMENT

BACKGROUND OF THE INVENTION

This invention relates to a process for interpolating position dependent periodic electrical signals generated by a digital position or angle measuring device. The invention is particularly suited for use with photoelectric measuring devices.

Incremental measuring systems of the prior art typically generate a series of electronic pulses whose number represents a measure of the change in the position or the angle of rotation being measured. These pulses are summed in an electronic up-down counter, and the sum is converted to a measurement value which is displayed numerically as a digital value.

The resolution capacity of such measuring systems is limited by the grid spacing of the precision measuring scale used. Attempts have been made in the past to improve the resolution of the digital measurement in such incremental measuring systems, especially through electronic measures.

In one well-known interpolation apparatus the primary analog signals from the scanning unit of the measuring device are phase-shifted to one another. These analog signals are applied to a resistance chain that includes a series of adjustable potentiometers. By tapping the potentiometers there can be generated a plurality of secondary signals that lie between the primary signals and thereby make possible an interpolation. The device disclosed in Swiss Pat. No. 407,569 is one example of such an interpolation apparatus.

In practice, interpolation devices with resistance networks for generating secondary signals are generally unsuitable for high resolution interpolation. The electronic circuitry expenditure required for interpolation rises enormously as the resolution of the interpolation rises. As a consequence, the high cost of high precision interpolating devices of the foregoing type is a significant drawback in many applications.

SUMMARY OF THE INVENTION

The present invention is directed to an interpolation process that permits high resolution interpolation within a signal period with a relatively small expenditure for electronic circuitry.

In this process at least one electrical analog signal is digitized and the digital values are fed to a digital computer programmed to compute interpolation values. Further features of the process of the invention are set forth in the appended claims.

With the interpolation process of this invention no appreciable increase in electronic circuitry is required to increase the resolution of interpolation. Accordingly, high resolution interpolation which increases the resolution of the measurement by a factor of one thousand, for example, can be performed with a relatively small expenditure for electronic circuitry. Microprocessors which are widely available today as economically feasible components are preferably used in the invention.

The invention itself, together with further objects and attendant advantages, will be best understood by reference to the following description taken in connection with the appended drawings.

DETAILED DESCRIPTION OF PREFERRED EMBODIMENTS

Figure 1:
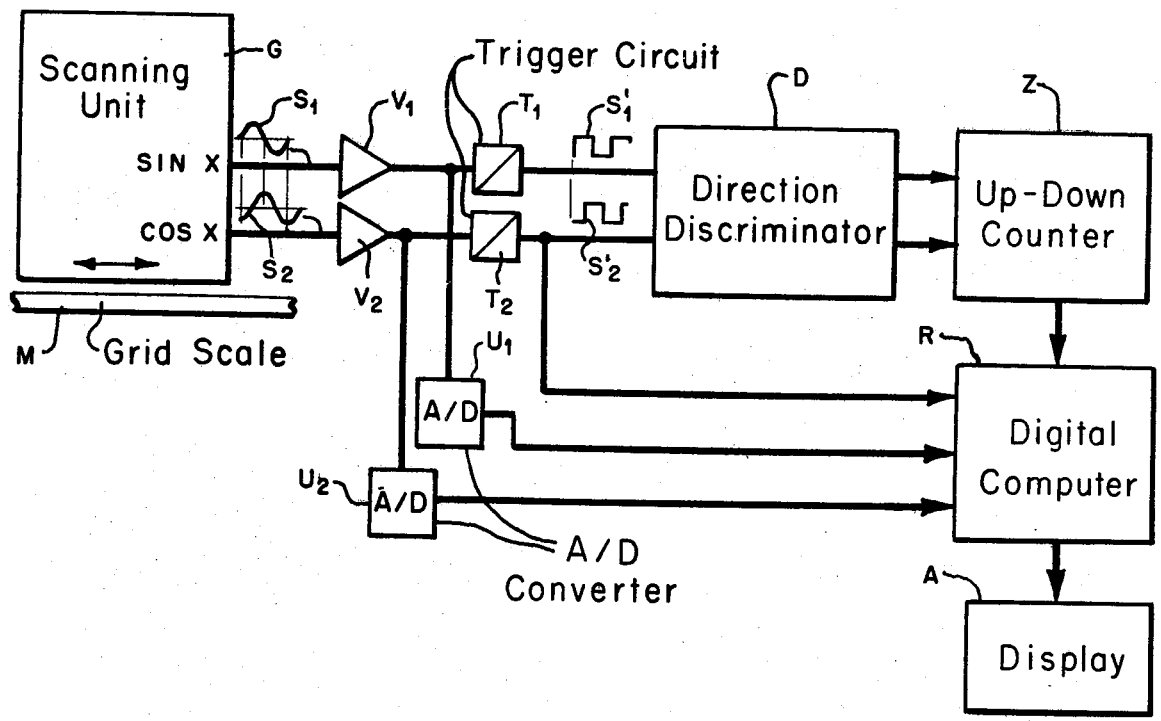
FIG. 1 is a schematic representation of a first measuring device embodying the interpolation process of this invention.

Referring now to the drawings, FIG. 1 schematically represents a linear incremental measuring system including a scanning unit G, and grid scale M. The scanning unit G and the scale M may be mounted on the bed or on the slide piece of a tooling or measuring machine, for example. The scanning unit G and the scale M are slidable relative to one another in the direction indicated by the arrow.

The scanning unit G includes a grid scanning plate, a light source, and photosensors (not shown) which generate electric analog signals $S_1, S_2$ in response to the instantaneous position of the scanning plate with respect to the grid M. Signals $S_1, S_2$ vary in a sinusoidal manner and are phase shifted 90° to one another. The analog signals $S_1, S_2$ are fed to amplifiers $V_1, V_2$, respectively, and the amplified signals are applied as inputs to the trigger circuits $T_1, T_2$, which operate to convert the signals $S_1, S_2$ into square waves $S_1', S_2'$. The square waves $S_1', S_2'$ are applied to a direction discriminator D, which is coupled to an electronic up-down counter Z. The counter Z counts pulses generated by the direction discriminator D using the appropriate sign to maintain an accurate total count. Measuring systems of the above-described type are generally known and, therefore, require no further explanation.

The present invention utilizes a digital computer R to interpolate position, i.e., to subdivide the periodic signals $S_1, S_2$ into a plurality of digital steps. Preferably a mincomputer or microprocessor is used for the computer R.

As shown in FIG. 1, analog to digital converters $U_1, U_2$ are used to digitize the analog signals $S_1, S_2$ and the digital values are supplied into the computer R for the calculation of interpolation values within a signal period. The counting result of the up-down counter Z and a binary control signal $S_2'$ are also fed into the computer R. The computer controls the display unit A to display position values in numerical form which indicate the relative position of the scanning unit G with respect to the scale M. The computer R is programmed to combine the values of the full signal period provided by the counter Z and the computed interpolation values to generate an interpolated position value.

Figure 2:
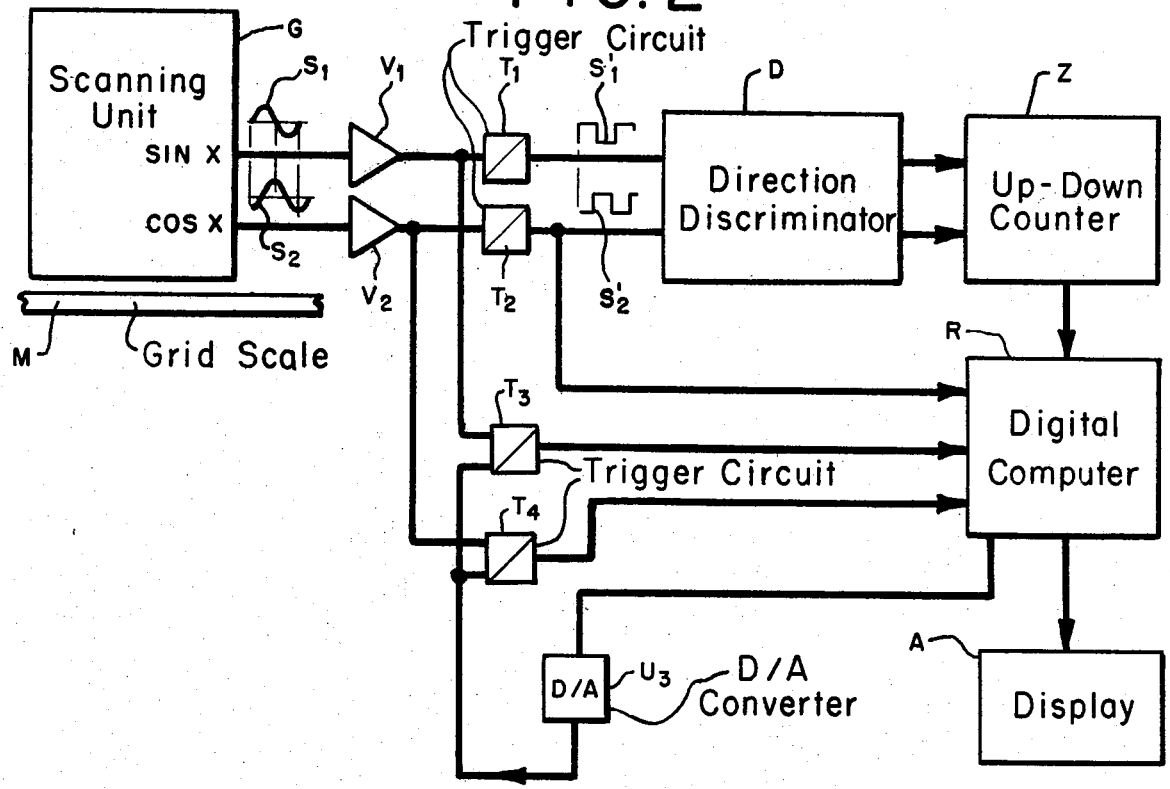
FIG. 2 is a schematic representation of a second measuring device embodying the invention.

FIG. 2 shows another circuit for digitizing the analog signals $S_1, S_2$. The circuit contains a digital to analog converter $U_3$ controlled by the computer R preferably a microprocessor. The output of the converter $U_3$ is applied to a first input of the difference trigger circuits $T_3, T_4$, and the amplified analog signals $S_1, S_2$ are applied to a second input of the input trigger circuits $T_3, T_4$, respectively. The signals generated by the triggers $T_3, T_4$ are transmitted to the computer R as input signals. Digitizing circuits such as the one just described are known to the prior art and are described, for example, on page 52 of the publication "MCS-4 Microcomputer Set" of the firm of Intel Corporation, Santa Clara; Users Manual, September 1974, Rev. 5 second printing.

One important advantage of the digitizing circuit shown in FIG. 2 is that the circuitry required to perform the desired interpolation is relatively simple and inexpensive to fabricate.

Figure 3:
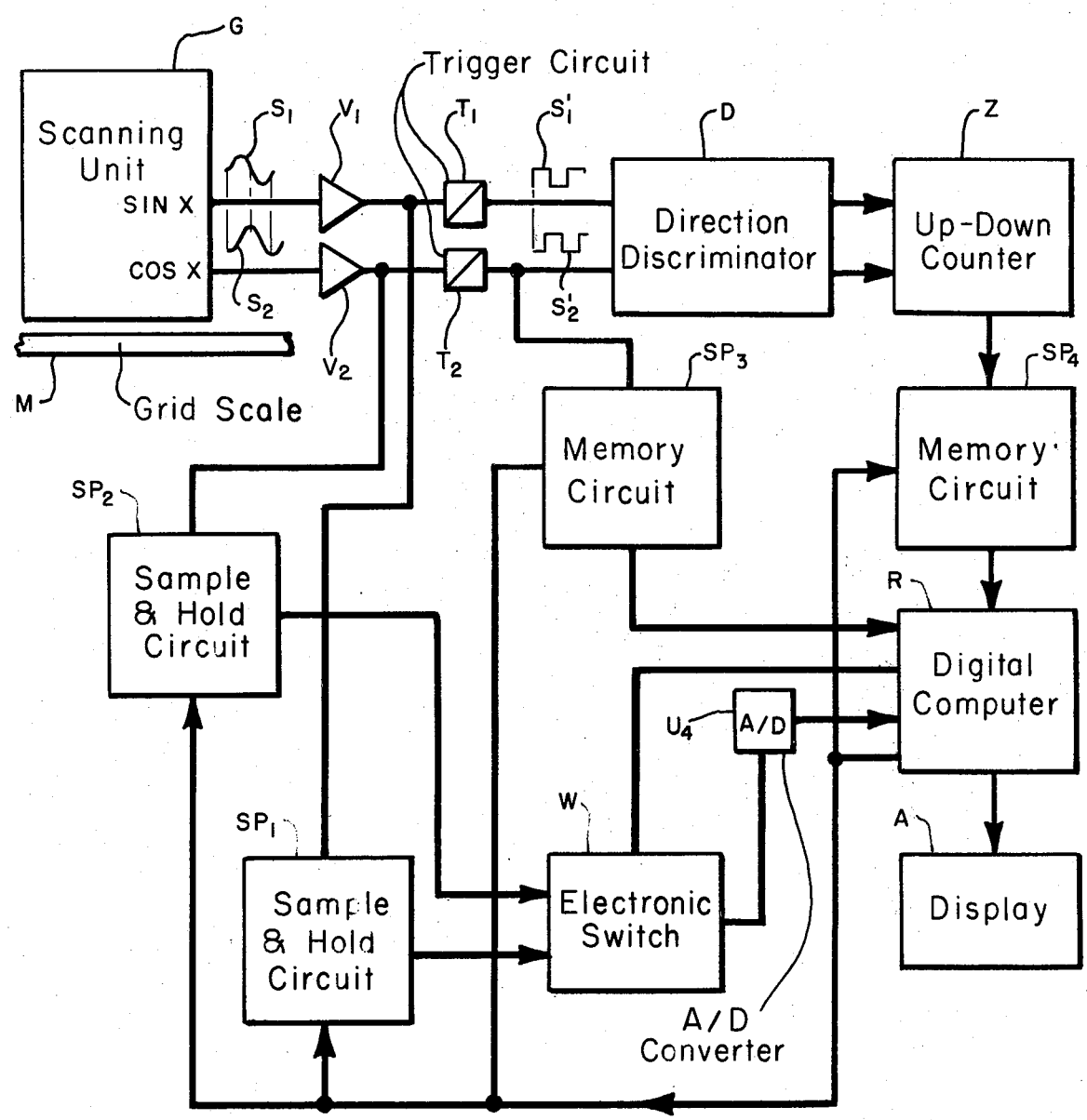
FIG. 3 is a schematic representation of a third measuring device embodying the invention which is capable of interpolation while the measurement is changing.

The circuit shown in FIG. 3 permits an interpolation to be made even during movement of the measuring system G.M. A pair of sample and hold circuits $SP_1, SP_2$ are provided on the input side of the analog to digital converter $U_4$. Additional memory units (digital memories) $SP_3, SP_4$ are provided in the lines between the computer R and the trigger circuit $T_2$ and the computer R and the up-down counter Z, respectively. The sample and hold circuits and memories $SP_1, SP_2, SP_3, SP_4$ are controlled by the computer R to store the instantaneous values of their respective input signals on command. Of course, it should be understood that the aforementioned memories $SP_1, SP_2, SP_3, SP_4$ can also be controlled by an external command.

The embodiment of FIG. 3 also utilizes a single analog to digital converter $U_4$. An electronic switch W is provided between the sample and hold circuits $SP_1, SP_2$ and the converter $U_4$. This switch W is controlled by the computer R, to connect the circuits $SP_1, SP_2$ alternately to the converter $U_4$.

In the preferred embodiments shown above the computer R can be programmed for high resolution interpolation. In such cases it is preferable to make certain corrections to the digital values input to the computer before the interpolation algorithm is applied. Preferably the digital values formed from the analog signals $S_1, S_2$ are corrected for symmetry by eliminating any DC offset, amplitude equality, and 90° phase shift. These corrections can be made with correction values stored in the computer R as a correction table.

The computer R can be programmed to calculate the interpolated position values P according to the following formula, for example:

$$P = N/2\pi \text{ arc tan } (U_{sin}/U_{cos})$$

if $U_{sin} \leq U_{cos}$ and, respectively,
$$P = (N/2\pi) \text{ arc cot } (U_{cos}/U_{sin})$$

if $U_{sin} > U_{cos}$

Where P is the interpolated position value;
N is the subdivision factor; and
$U_{sin}$ and $U_{cos}$ are momentary values of the voltages of the output signals $S_1$ and $S_2$.

The corresponding programming of the computer R is familiar to the worker in the field and, therefore, requires no detailed explanation.

Of course, it should be understood that various changes and modifications to the preferred embodiments described herein will be apparent to those skilled in the art. For example, the invention is not restricted to the photoelectric measuring system described, but the interpolation system of this invention can also be used in association with inductive, magnetic, or capacitive measuring systems. Furthermore, the invention is not restricted to use with measuring systems employing sinusoidal analog signals but instead is also usable with other periodic analog signals, such as triangular signals, for example. Such changes and modifications can be made without departing from the spirit and scope of the present invention and without diminishing its attendant advantages.

I claim:

1. An interpolation apparatus for evaluating at least one periodic analog signal generated by an electronic position measuring device having a measuring scale and a scanning unit, moveable relative to the scale, said analog signal having an amplitude which varies in a periodic manner as a function of the position of the scanning unit with respect to the scale, said apparatus comprising:
   digitizing means, responsive to the analog signal, for digitizing the analog signal to generate a first digital signal which corresponds in a predetermined manner with the amplitude of the analog signal;
   a digital computer responsive to the first digital signal;
   interpolating means, included in the computer, for generating an interpolation signal in response to the digital signal, said interpolation signal being representative of the position of the scanning unit with respect to the scale and having a higher resolution than the spatial period of the periodic analog signal; and
   evaluating means, also responsive to the analog signal, for generating a second digital signal representative of the position of the scanning unit with respect to the scale, said second digital signal having a spatial resolution lower than that of the interpolation signal.

2. The apparatus of claim 1, wherein the digitizing means includes means for selectively storing the momentary analog amplitude of the analog signal and means for digitizing the stored analog amplitude to generate the first digital signal.

3. The apparatus of claim 1 further comprising means, included in the digital computer, for modifying the first digital signal to correct errors in the first digital signal and supplying the modified first digital signal to the interpolating means.

4. An interpolation apparatus for evaluating first and second periodic analog signals generated by an electronic position measuring device having a measuring scale and a scanning unit, moveable with respect to the scale, said first and second periodic analog signals having a substantially fixed phase relationship, each of said periodic analog signals having an amplitude which varies in a periodic manner as a function of the position of the scanning unit with respect to the scale, said apparatus comprising:
   digitizing means, responsive to said first and second analog signals, for digitizing said first and second analog signals to generate first and second digital signals which correspond in a predetermined manner with the amplitudes of the first and second analog signals, respectively;
   computer means, responsive to the first and second digital signals, for generating an interpolation signal from the first and second digital signals such that the interpolation signal is representative of the position of the scanning unit with respect to the scale, said interpolation signal having a spatial resolution higher than the spatial period of the first and second periodic analog signals; and
   evaluating means, also responsive to the first and second analog signals, for generating a third digital signal representative of the position of the scanning unit with respect to the scale, said third digital signal having a spatial resolution lower than that of the interpolation signal.

5. The apparatus of claim 4, further including means for combining the interpolation signal with the third digital signal to produce a composite signal representative of the position of the scanning unit with respect to the measuring scale.

6. The apparatus of claim 4 wherein the computer is programmed to calculate interpolation values according to the following formulae:

$$P = (N/2\pi) \arctan (U_{sin}/U_{cos}), \text{ if } U_{sin} \leq U_{cos};$$

$$P = (N/2\pi) \text{arc cot } (U_{cos}/U_{sin}), \text{ if } U_{sin} > U_{cos};$$

where P is the interpolation value, N is the subdivision factor, $U_{sin}$ is the instantaneous value of the first analog signal, and $U_{cos}$ is the instantaneous value of the second analog signal.

7. An interpolation apparatus for evaluating first and second periodic analog signals generated by an electronic position measuring device having a measuring scale and a scanning unit, moveable with respect to the scale, said first and second periodic analog signals having a substantially fixed phase relationship, each of said periodic analog signals having an amplitude which varies in a periodic manner as a function of the position of the scanning unit with respect to the scale, said apparatus comprising:

counter means, responsive to the first and second analog signals, for maintaining a running count representative of the cumulative number of cycles of the first and second analog signals;

digitizing means, responsive to said first and second analog signals, for digitizing said first and second analog signals to generate first and second digital signals which correspond in a predetermined manner with the amplitudes of the first and second analog signals, respectively;

a digital computer, responsive to the count and the first and second digital signals;

means, included in the computer, for generating an interpolation signal value from the first and second digital signals such that the interpolation signal is representative of the position of the scanning unit with respect to the scale, said interpolation signal having a spatial resolution higher than the spatial period of the first and second analog signals;

means, included in the computer, for combining the interpolation signal with the count to generate a composite signal; and display means, responsive to the composite signal, for displaying the composite signal.

8. The apparatus of claim 7, further including means, included in the computer, for correcting the first and second digital signals by eliminating DC offset of the first and second digital signals, by equalizing the amplitudes of the first and second digital signals, and by correcting the phase difference between the first and second digital signals to a predetermined value, wherein correction parameters used in the digital signal corrections are stored in the computer.

* * * * *